United States Patent
Makiyama

(10) Patent No.: US 9,455,273 B2
(45) Date of Patent: Sep. 27, 2016

(54) SEMICONDUCTOR DEVICE

(71) Applicant: Renesas Electronics Corporation, Koutou-ku, Tokyo (JP)

(72) Inventor: Hideki Makiyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/920,823

(22) Filed: Oct. 22, 2015

(65) Prior Publication Data

US 2016/0118407 A1  Apr. 28, 2016

(30) Foreign Application Priority Data

Oct. 22, 2014 (JP) ................... 2014-215244

(51) Int. Cl.
  *H01L 27/12* (2006.01)
(52) U.S. Cl.
  CPC .................. *H01L 27/1203* (2013.01)
(58) Field of Classification Search
  USPC ............. 257/E27.098–E27.101, E27.077, 257/E21.661, E39, 903, 351; 365/185.2, 365/210.1
  See application file for complete search history.

(56) References Cited

U.S. PATENT DOCUMENTS

| 6,118,158 A * | 9/2000 | Kim ........................ H01L 27/11 257/369 |
| 8,422,274 B2 * | 4/2013 | Tomita ................... G11C 11/412 257/E21.661 |
| 2011/0019464 A1 * | 1/2011 | McMullan ............ G11C 11/412 365/156 |
| 2011/0157965 A1 * | 6/2011 | Nii ....................... G11C 11/4125 365/156 |

FOREIGN PATENT DOCUMENTS

| JP | 11-039879 A | 2/1999 |
| JP | 2011-090782 A | 5/2011 |

\* cited by examiner

*Primary Examiner* — Dao H Nguyen
*Assistant Examiner* — Tram H Nguyen
(74) *Attorney, Agent, or Firm* — Shapiro, Gabor and Rosenberger, PLLC

(57) ABSTRACT

In a semiconductor device having an SRAM memory cell, its reliability is improved. In the semiconductor device having the SRAM memory cell, electrically-independent four semiconductor regions functioning as back gates are provided below two load transistors and two driver transistors, so that threshold voltages for the load transistors and driver transistors are controlled. And, the two n-type semiconductor regions provided below the two load transistors are electrically isolated from each other by a p-type semiconductor region.

20 Claims, 12 Drawing Sheets

FIG. 9

| | DVN1 (DNW1) | LVP (LPW) | LVN (LNW) | DVP (DPW) | RVN (RNW) | RVP (RPW) | DVN2 (DNW2) |
|---|---|---|---|---|---|---|---|
| "1" WRITING | Vc(>Vb) | −Vb | −Vb | Va(<<−Vb) | Vb | Vb | Vc(>Vb) |
| "0" WRITING | Vc(>Vb) | Vb | Vb | Va(<<−Vb) | −Vb | −Vb | Vc(>Vb) |

US 9,455,273 B2

SEMICONDUCTOR DEVICE

CROSS-REFERENCE TO RELATED APPLICATION

The present application claims priority from Japanese Patent Application No. 2014-215244 filed on Oct. 22, 2014, the content of which is hereby incorporated by reference into this application.

TECHNICAL FIELD OF THE INVENTION

The present invention relates to a semiconductor device. More particularly, the present invention relates to a technique effectively applied to a semiconductor device having a MOS or SRAM arranged in an SOI substrate.

BACKGROUND OF THE INVENTION

AN SRAM (Static Random Access Memory) is a type of a semiconductor memory that stores data using a flip flop. For example, in the SRAM, data ("1" or "0") is stored in two cross-connected CMOS inverters configured of four transistors. Also, since two transistors are required for read/write access, a memory cell in a typical SRAM is configured of six transistors. CMOS is an abbreviation of complementary MOS (Metal Oxide Semiconductor).

For example, Patent Document 1 (Japanese Patent Application Laid-Open Publication No. H11-39879) discloses that a circuit element that selectively changes a substrate potential of an SRAM unit is provided and that a threshold voltage for a MOSFET of the SRAM unit is changed by the circuit element. And, the document discloses a technique for suppressing overall power consumption as the high-speed operation of the SRAM unit is maintained by changing the threshold voltage between a write operation and a read operation.

Patent Document 2 (Japanese Patent Application Laid-Open Publication No. 2011-90782) discloses that a performance of an SRAM is improved by configuring a static memory cell by SOI (Silicon On Insulator) transistors and changing a current of each transistor by appropriately controlling a potential of a well layer on a lower side of a buried oxide (BOX) layer of each transistor.

A third example of Patent Document 2 discloses that an nMOS connected in series between a left bit line BLT and a VSS node in a memory cell and an nMOS connected in series between a right bit line BLB and the VSS node in the memory cell are at potentials of different well nodes VBN1 and VBN2, respectively. Also, a fourth example thereof discloses a configuration derived from the configuration of the third example, in which respective well nodes for left/right pMOSs in the memory cell are also controlled separately.

SUMMARY OF THE INVENTION

In Patent Document 2, as shown in FIGS. 3 to 7, a transistor is formed in an SOI layer 15, and a well 4 is formed through a buried oxide film (BOX) layer 6 below the SOI layer 15. And, the SOI layer, the buried oxide film layer 6, and the well 4 are surrounded by element isolation layers 7 and 13, and the SOI layer 15 and the well 4 are separated from an adjacent transistor by the element isolation layers 7 and 13. That is, it is required to form the element isolation layers 7 and 13 deeper than the well.

The element isolation layers 7 and 13 are formed by, for example, forming a deep trench in a surface of a semiconductor substrate and burying an insulating film such as a silicon oxide film in the trench. According to a study made by the inventor of the present application, it is very difficult to form the deep trench whose width is narrow in a plan view and to bury the insulating film in the deep trench whose width is narrow, and therefore, it is difficult to provide the element isolation layers 7 and 13 which are highly reliable in terms of an insulation performance. That is, it is found that the document has a problem of reduction in the reliability of the SRAM having the element isolation layers 7 and 13 formed so as to have the deep trench.

An object of the present invention is to provide a highly reliable semiconductor device. More particularly, the object thereof is to improve the reliability of a semiconductor device having an SRAM memory cell.

The above and other objects and novel characteristics of the present invention will be apparent from the description of the specification and the accompanying drawings in the present application.

According to one embodiment, in a semiconductor device having an SRAM memory cell, four semiconductor regions LPW, LNW, RNW, and RPW which are functioned as back gates and are electrically independent of each other are provided below two load transistors (Lo1 and Lo2) and two driver transistors (Dr1 and Dr2), respectively, so that threshold voltages for the load transistors (Lo1 and Lo2) and the driver transistors (Dr1 and Dr2) are controlled. And, the two n-type semiconductor regions (LNW and RNW) provided below the two load transistors (Lo1 and Lo2) are electrically isolated from each other by a p-type semiconductor region DPW.

According to one embodiment, the reliability of a semiconductor device having an SRAM memory cell can be improved.

BRIEF DESCRIPTIONS OF THE DRAWINGS

FIG. 9 is a table showing a potential of a well feeder line caused at the time of a write operation of the memory cell of the SRAM according to the present embodiment;

DESCRIPTIONS OF THE PREFERRED EMBODIMENTS

Figure 1:
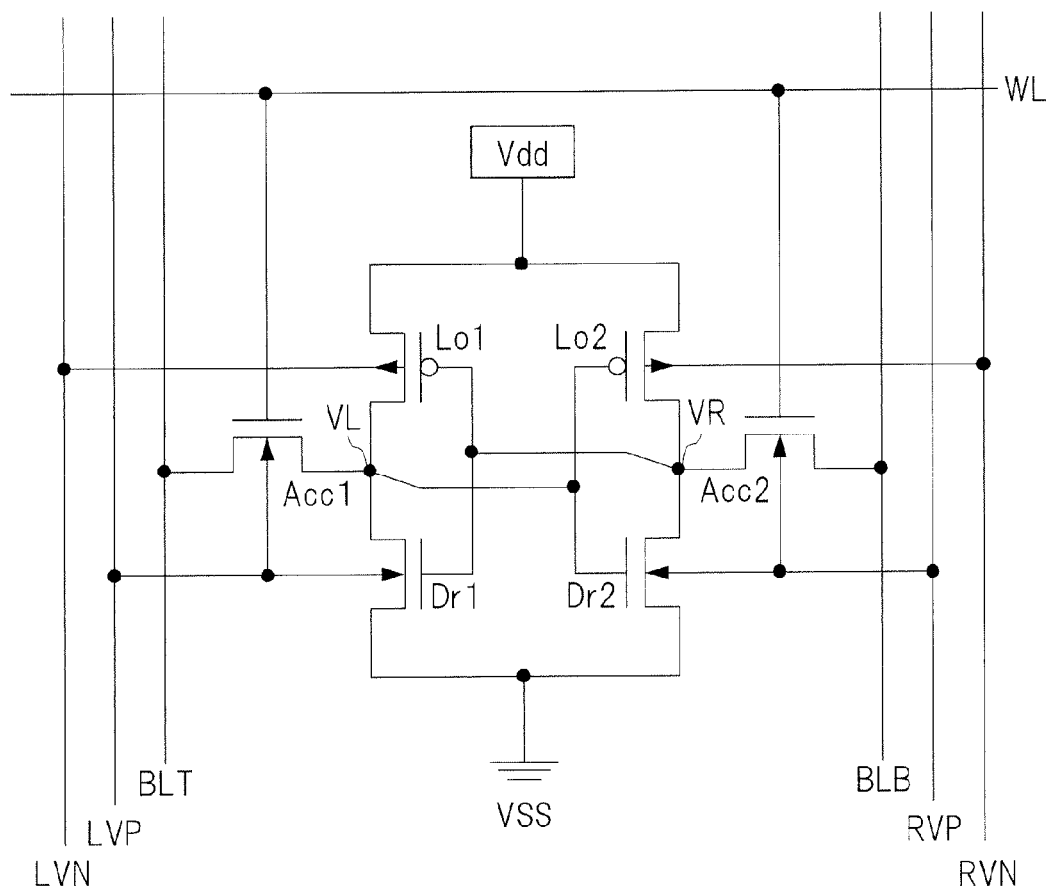
FIG. 1 is an equivalent circuit diagram showing a memory cell of an SRAM according to the present embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, an application example, details, a supplementary explanation thereof, or others. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value (including number of pieces, values, amount, range, and the like) described above.

Hereinafter, embodiments of the present invention will be described in detail with reference to the accompanying drawings. Note that components having the same function are denoted by the same ore relating reference symbols throughout all the drawings for describing the embodiments, and the repetitive description thereof is omitted. Also, when there are a plurality of similar members (parts), an individual or specific part may be denoted by adding a mark to a numerical symbol of a generic name. Further, in the embodiments described below, the description of the same or similar parts is not repeated in principle unless otherwise particularly required.

Also, in some drawings used in the embodiments, hatching may be omitted even in a cross-sectional view so as to make the drawings easy to see. Further, hatching may be used even in a plan view so as to make the drawings easy to see.

Still further, in cross-sectional views and plan views, a size of each part does not correspond to that of an actual device. In order to make the drawings easy to understand, a specific part may be shown to be relatively large. Moreover, even when the plan views and the cross-sectional views correspond thereto, the size of each part may be shown as being changed.

Embodiment

A semiconductor device (semiconductor integrated circuit device or semiconductor memory device) according to the present embodiment includes an SRAM memory region. The memory area has a memory array MA in which SRAM memory cells are arranged in a matrix form, and a feeding region (feeder portion) PF for applying a desired voltage to a well region.

[Circuit Configuration]

A circuit configuration of an SRAM memory cell of the semiconductor device (semiconductor integrated circuit device or semiconductor memory device) according to the present embodiment will first be described. FIG. 1 is an equivalent circuit diagram showing the SRAM memory cell MC according to the present embodiment. As shown in the drawing, the memory cell MC is arranged at an intersection between a pair of bit lines (bit line BLT and bit line BLB) and a word line WL. The bit lines (BLT and BLB) and the word line WL extend in directions perpendicular to each other. The memory cell MC has a pair of load transistors (load MOS, load transistor, load MISFET) Lo1 and Lo2, a pair of access transistors (access MOS, access transistor, access MISFET, transfer transistor) Acc1 and Acc2, and a pair of driver transistors (driver MOS, driver transistor, driver MISFET) Dr1 and Dr2.

The load transistors (Lo1 and Lo2) of the above-described six transistors making up the above-described memory cell are p-type (p-channel) transistors (pMOS, p-channel transistor), and the access transistors (Acc1 and Acc2) and the driver transistors (Dr1 and Dr2) thereof are n-type (n-channel) transistors (nMOS, n-channel transistor).

Note that MISFET is an abbreviation of Metal Insulator Semiconductor Field Effect Transistor and is often referred to as MOS. Also, in the following description, the above-described load transistor, access transistor, and driver transistor may be simply referred to as "transistor". And, each transistor may be denoted simply as only a reference symbol of each transistor (Lo1, Lo2, Acc1, Acc2, Dr1, or Dr2).

The load transistor Lo1 and the access transistor Acc1 of the above-described six transistors making up the above-described memory cell make up a CMOS inverter (which may be referred to as "left inverter"), and the load transistor Lo2 and the access transistor Acc2 thereof make up another CMOS inverter (which may be referred to as "right inverter"). Respective input/output terminals (storage nodes VL and VR) of this pair of CMOS inverters connected so as to cross each other, and make up a flip-flop circuit serving as a data storage unit that stores 1-bit data.

The connection relation among the six transistors making up the above-described SRAM memory cell will be described as follows in detail.

The load transistor Lo1 is connected between a source potential (first potential) Vdd and the storage node VL, the driver transistor Dr1 is connected between the storage node VL and a ground potential (GND, 0 V, reference potential, second potential lower than the first potential) VSS, and the gate electrodes of the load transistor Lo1 and driver transistor Dr1 are connected to the storage node VR.

The load transistor Lo2 is connected between the source potential Vdd and the storage node VR, the driver transistor Dr2 is connected between the storage node VR and the ground potential VSS, and the gate electrodes of the load transistor Lo2 and driver transistor Dr2 are connected to the storage node VL.

A source of the load transistor Lo1 is connected to the source potential Vdd and a drain thereof is connected to the storage node VL, and a drain of the driver transistor Dr1 is connected to the storage node VL and a source thereof is connected to the ground potential VSS. Similarly, a source of the load transistor Lo2 is connected to the source potential Vdd and a drain thereof is connected to the storage node VR, and a drain of the driver transistor Dr2 is connected to the storage node VR and a source thereof is connected to the ground potential VSS.

The access transistor Acc1 is connected between the bit line BLT and the storage node VL, the access transistor Acc2 is connected between the bit line BLB and the storage node VR, and the gate electrodes of the access transistor Acc1 and access transistor Acc2 are connected to the word line WL.

Here, in the present embodiment, the six transistors are formed in a semiconductor region 3 formed of an SOI layer of an SOI substrate as described later (see FIGS. 2 and 3).

Further, each of the load transistors (Lo1 and Lo2), the driver transistors (Dr1 and Dr2), and the access transistors (Acc1 and Acc2) of the present embodiment has a back gate. The back gate of the present embodiment is a p-type or n-type semiconductor region (well region, back gate region) arranged below the semiconductor region 3 through a buried insulating film BOX. A p-type semiconductor region (well region, back gate region) may be referred to as "p-well region", and an n-type semiconductor region (well region, back gate region) may be referred to as "n-well region". The back gate of the load transistor Lo1 is connected to a well feeder line LVN, while the back gate of the load transistor Lo2 is connected a well feeder line RVN. The back gates of the driver transistor Dr1 and access transistor Acc1 are connected to a well feeder line LVP, while the back gates of the driver transistor Dr2 and access transistor Acc2 are connected to a well feeder line RVP. The well feeder lines (LVN, LVP, RVN, and RVP) extend in a direction as the same as that of the bit lines (BLT and BLB), that is, a direction perpendicular to the word line WL.

[Configuration of Transistor]

Here, a schematic configuration of the SRAM memory cell according to the present embodiment will be described with reference to FIGS. 2 and 3. FIG. 2 is a schematic cross-sectional view of each of the driver transistor (Dr1) and the access transistor (Acc1) that make up the SRAM memory cell according to the embodiment. Note that the driver transistor (Dr2) and the access transistor (Acc2) have the similar configuration.

Figure 3:
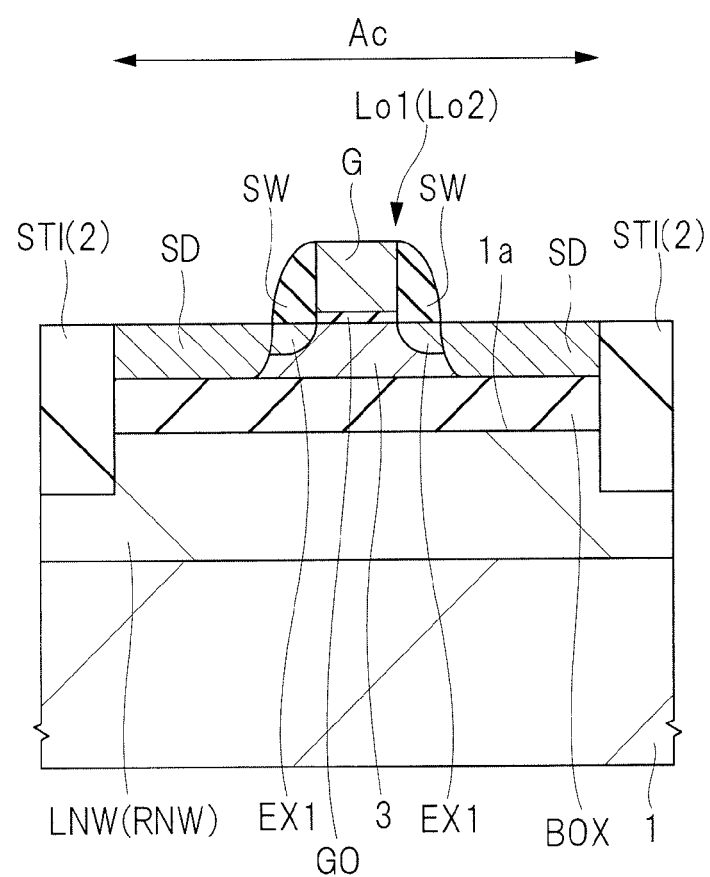
FIG. 3 is a schematic cross-sectional view of a load transistor (Lo1) making up the memory cell of the SRAM according to the present embodiment.

FIG. 3 is a schematic cross-sectional view of the load transistor (Lo1) making up the SRAM memory cell according to the embodiment. Note that the load transistor (Lo2) has the similar configuration.

Figure 2:
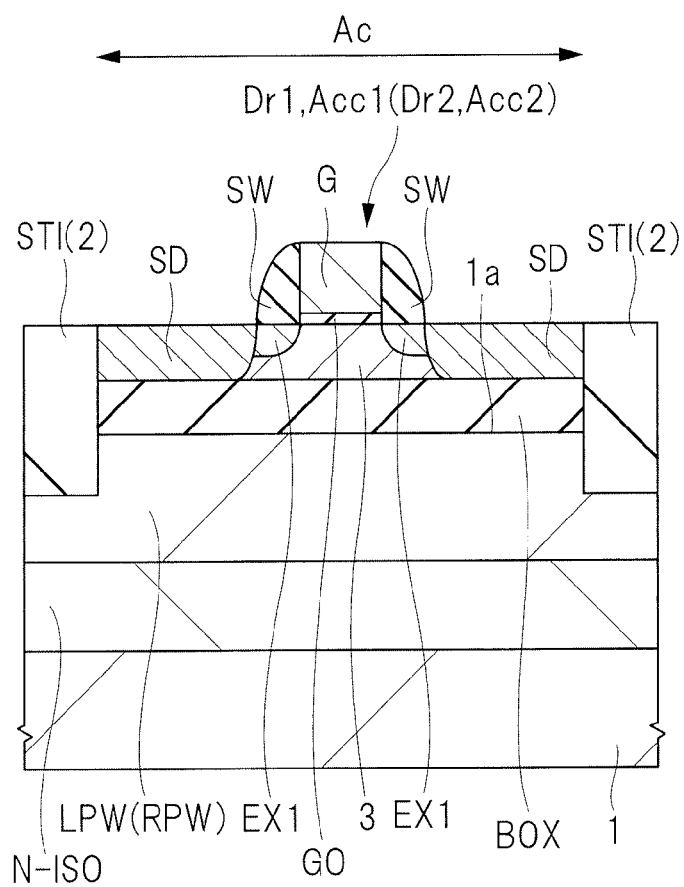
FIG. 2 is a schematic cross-sectional view of each of a driver transistor (Dr1) and an access transistor (Acc1) that make up the memory cell of the SRAM according to the present embodiment.

As shown in FIGS. 2 and 3, the six transistors making up the SRAM memory cell of the embodiment are formed on the SOI substrate. The SOI substrate has a support substrate 1 that is a semiconductor substrate made of p-type silicon, etc., the buried insulating film BOX over the support substrate 1, and the semiconductor region (semiconductor layer, element forming region) 3 over the buried insulating film BOX. The semiconductor region 3 is divided by an element isolating region STI, and the region defined by this element isolating region STI becomes an active region (element forming region, transistor forming region) Ac. An element isolating film 2 is formed in the element isolating region STI, and a film thickness of the element isolating film 2 is larger (thicker) than a total film thickness of the buried insulating film BOX and semiconductor region 3. That is, the element isolating film 2 covers side surfaces of the semiconductor region 3 and buried insulating film BOX, and extends from a main surface 1a of the support substrate 1 to inside of the support substrate 1.

As shown in FIG. 2, each of the driver transistor Dr1 and access transistor Acc1 is formed in a main front surface (front surface) of the semiconductor region 3 making up the SOI substrate. This transistor has a gate electrode G arranged over the semiconductor region 3 through a gate insulating film GO, and source/drain regions arranged on both sides of the gate electrode G. The source/drain regions have an LDD (Lightly Doped Drain) structure having an n-type low-concentration impurity region EX1 and an n-type high-concentration impurity region SD. The low-concentration impurity region EX1 is formed in a self-alignment form with respect to the gate electrode G, while the high-concentration impurity region SD is formed in a self-alignment form with respect to the gate electrode G and a side wall insulating film SW. Note that the source/drain region means a region to be a source or a drain. Note that a metal silicide layer may be formed in surfaces of the gate electrode and the high-concentration impurity region SD although not shown.

Below the semiconductor region 3 in which the transistor is arranged, a p-type semiconductor region (well region, back gate region) LPW is arranged through the buried insulating film BOX, and functions as the back gate of the transistor. A bottom portion of the p-type semiconductor region LPW is at a position deeper than a bottom portion of the element isolating region STI (or element isolating film 2). Further, an n-type semiconductor region (well region) N-ISO whose conductivity is reverse to that of the p-type semiconductor region LPW is formed below the p-type semiconductor region LPW, and the n-type semiconductor region (well region) N-ISO is a region for electrically isolating the p-type semiconductor region LPW from the p-type support substrate 1.

In the case of the driver transistor Dr2 and access transistor Acc2, the back gate is a p-type semiconductor region RPW. Others are the same as the driver transistor Dr1 and access transistor Acc1.

As shown in FIG. 3, the load transistor Lo1 is formed in the main surface of the semiconductor region 3 making up the SOI substrate. This transistor has the gate electrode G arranged over the semiconductor region 3 through the gate insulating film GO, and the source/drain regions arranged on both sides of the gate electrode G. Each source/drain region has the LDD structure having the p-type low-concentration impurity region EX1 and the p-type high-concentration impurity region SD. The low-concentration impurity region EX1 is formed in a self-alignment form with respect to the gate electrode G, while the high-concentration impurity region SD is formed in a self-alignment form with respect to the gate electrode G and the side wall insulating film SW. Note that the source/drain region means a region to be a source or a drain. Note that a metal silicide layer may be formed in surfaces of the gate electrode G and the high-concentration impurity region SD although not shown.

An n-type semiconductor region (well region, back gate region) LNW is arranged through the buried insulating film BOX below the semiconductor region 3 in which the load transistor Lo1 is arranged, and functions as the back gate of the load transistor Lo1. A bottom portion of the n-type semiconductor region LNW is at a position deeper than a bottom portion of the element isolating region STI. Further, as described above, the n-type semiconductor region LNW has conductivity reverse to that of the p-type support substrate 1.

In the case of the load transistor Lo2, the back gate is an n-type semiconductor region RNW. Others are the same as the load transistor Lo1.

Each of the driver transistors (Dr1 and Dr2), access transistors (Acc1 and Acc2), and load transistors (Lo1 and Lo2), which have been described with reference to FIGS. 2 and 3, has a fully-depleted transistor structure, and a thickness of the buried insulating film BOX is 20 nm or less, specifically, about 10 nm, which is a structure that can obtain sufficient threshold voltage fluctuation even if a voltage applied to the back gate is low.

Figure 4:
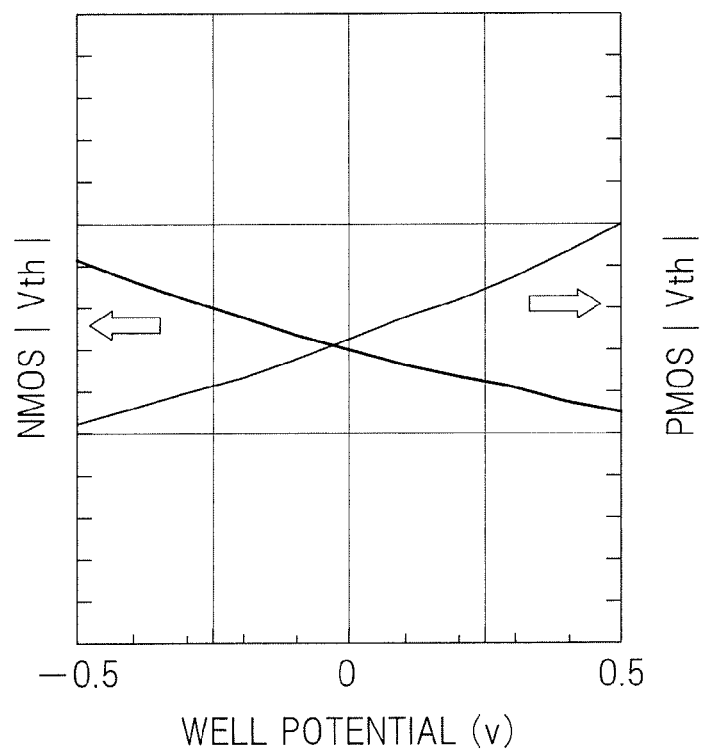
FIG. 4 is a diagram showing a relation between a well potential of a back gate of a pMOS or nMOS and a threshold voltage (Vth) according to the present embodiment.

FIG. 4 is a diagram showing the relation between the well potential of the back gate of the pMOS or nMOS of the embodiment and a threshold voltage (Vth). Note that the threshold voltage is shown as an absolute value. In the case of the pMOS, application of a negative well potential to the back gate decreases the threshold voltage while application of a positive potential to the back gate increases the threshold voltage in comparison with the case of the well potential being 0 V. In the case of the nMOS, application of a negative well potential to the back gate increases the threshold voltage while application of a positive potential to the back gate decreases the threshold voltage in comparison with the case of the well potential being 0 V.

[Structure of SRAM Memory Cell]

Next, the structure of the SRAM memory cell according to the present embodiment will be described in detail with reference to plan views and cross-sectional views.

Figure 5:
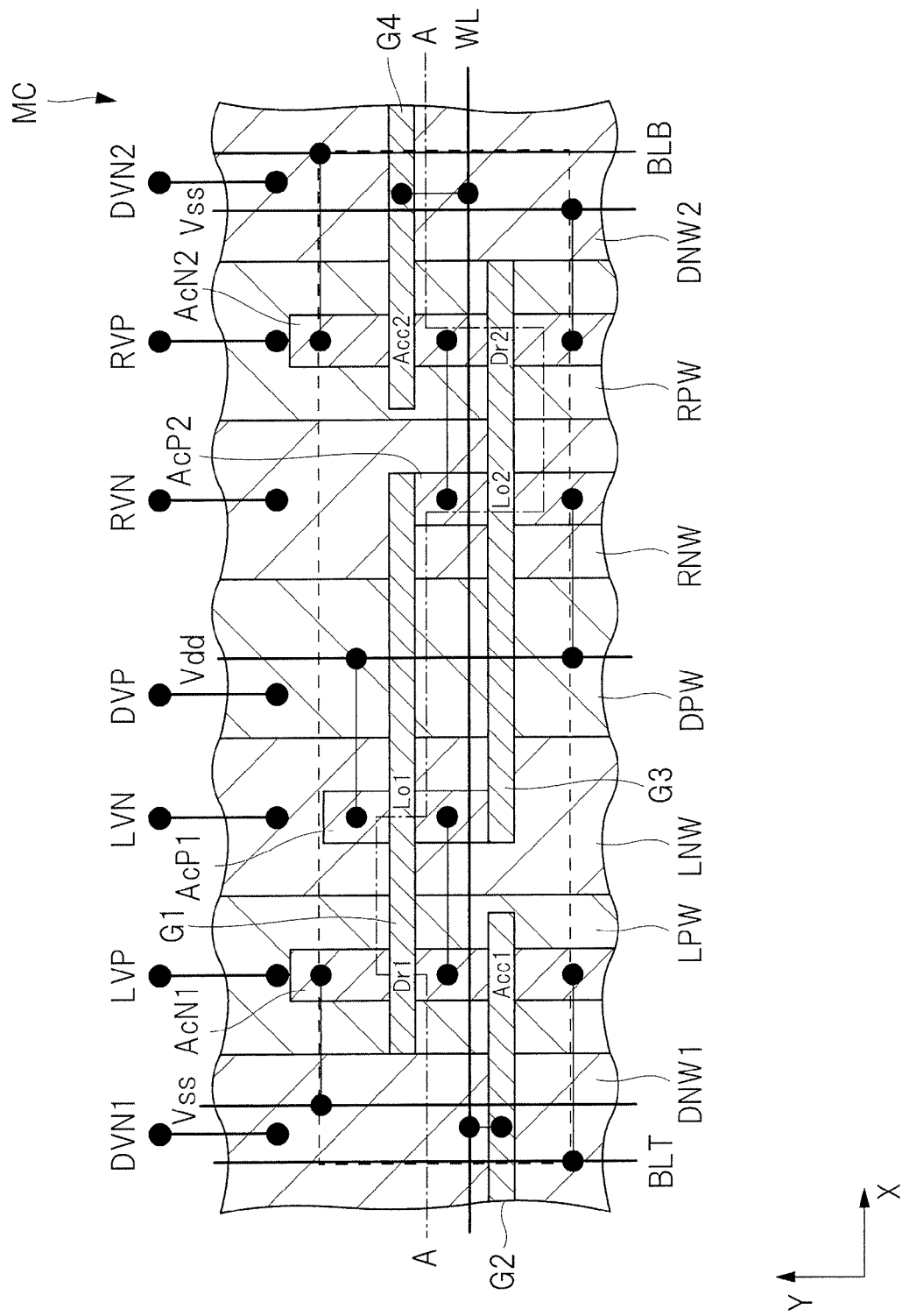
FIG. 5 is a plan view showing a configuration of a memory cell region of the SRAM according to the present embodiment.
Figure 6:
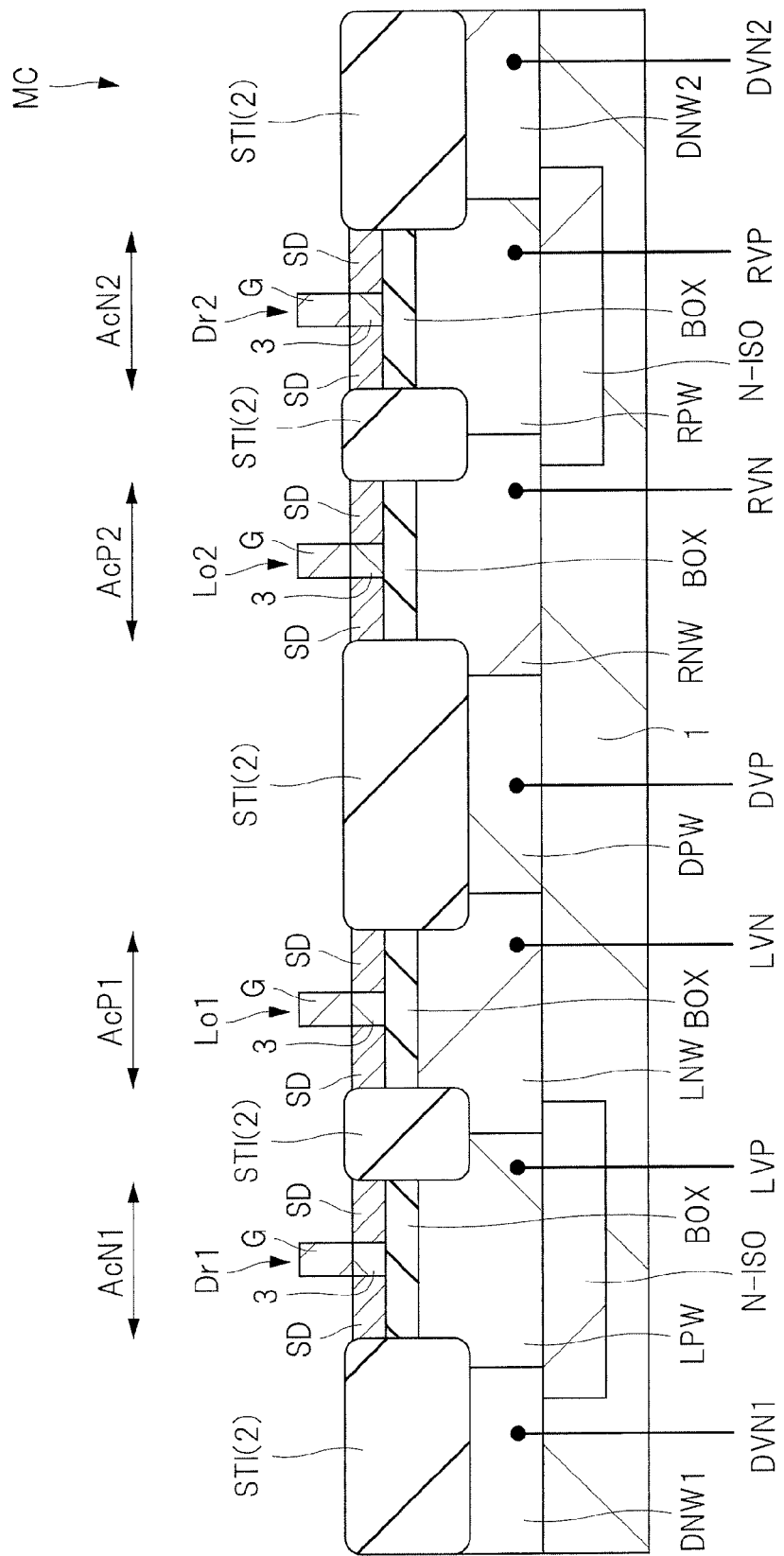
FIG. 6 is a cross-sectional view taken along a line A-A of FIG. 5.

FIGS. 5 and 6 are a plan view and a cross-sectional view each showing a configuration of the SRAM memory cell region according to the present embodiment. FIG. 6 is a cross-sectional view taken along a line A-A of FIG. 5. In FIG. 6, note that the gate insulating film GO and the side wall insulating films SW are omitted.

In FIG. 5, a region surrounded by a substantially rectangular broken line is one (1-bit) memory cell MC. As shown in FIG. 5, four active regions (AcN1, AcP1, AcP2, and AcN2) are arranged in a row sequentially in an X direction. The four active regions (AcN1, AcP1, AcP2, and AcN2) are arranged so as to be separated from each other in the X direction. Here, an individual region is indicated by applying a mark to a reference symbol "Ac" denoting the active region. A portion between these active regions (Ac) becomes the element isolating region (STI) as described above. In other words, the active region (Ac) is defined by the element isolating region (STI).

As described above, the semiconductor regions (LPW, LNW, RNW, and RPW) are arranged below the active region (Ac) through the buried insulating film BOX in this order from left to right in FIG. 5. Each of the semiconductor regions (LPW, LNW, RNW, and RPW) has a predetermined width, and extends in the Y direction (in which the bit lines extend). In the X direction, the p-type semiconductor region LPW and the n-type semiconductor region LNW are close to each other so as to form a PN junction, and the PN junction is positioned in the element isolating region STI when seen in a plan view. In the X direction, the p-type semiconductor region RPW and the n-type semiconductor region RNW are close to each other so as to form a PN junction, and the PN junction is positioned in the element isolating region STI when seen in a plan view. A p-type semiconductor region (dummy p-well region) DPW is arranged between the n-type semiconductor regions (LNW and RNW), and extends with a predetermined width in the Y direction. In the X direction, the p-type semiconductor region DPW is arranged below the element isolating film 2 of the element isolating region STI which isolates the active regions (AcP1 and AcP2) from each other. In the X direction, each of the n-type semiconductor regions (LNW and RNW) forms the PN junction with the p-type semiconductor region DPW, and the PN junction is positioned in the element isolating region when seen in a plan view.

In the X direction, an n-type semiconductor region (dummy n-well region) DNW1 is close to the p-type semiconductor region LPW, and extends with a predetermined width in the Y direction. The n-type semiconductor region DNW1 is arranged so as to be opposite to the n-type semiconductor region LNW with respect to the p-type semiconductor region LPW. That is, the p-type semiconductor region LPW is sandwiched between the n-type semiconductor regions (DNW1 and LNW).

In the X direction, an n-type semiconductor region (dummy n-well region) DNW2 is close to the p-type semiconductor region RPW, and extends with a predetermined width in the Y direction. The n-type semiconductor region DNW2 is arranged so as to be opposite to the n-type semiconductor region RNW with respect to the p-type semiconductor region RPW. That is, the p-type semiconductor region RPW is sandwiched between the n-type semiconductor regions (DNW2 and RNW). The n-type semiconductor regions (DNW1 and DNW2) are arranged below the element isolating film 2 of the element isolating region STI.

That is, seven semiconductor regions (DNW1, LPW, LNW, DPW, RNW, RPW, and DNW2) are included in one (1-bit) memory cell MC.

Four active regions (AcN1, AcP1, AcP2, and AcN2) are formed sequentially in the p-type or n-type semiconductor regions (LPW, LNW, RNW, and RPW). When seen in a plan view, the width of the active region AcN1 in the X direction is smaller than the width of the p-type semiconductor region LPW, and the active region AcN1 is sandwiched on its both sides in the X direction by the element isolating film 2 arranged over the p-type semiconductor region LPW (see FIG. 6). When seen in a plan view, the width of the active region AcP1 in the X direction is smaller than the width of the n-type semiconductor region LNW, and the active region AcP1 is sandwiched on its both sides in the X direction by the element isolating film 2 arranged over the n-type semiconductor region LNW (see FIG. 6). When seen in a plan view, the width of the active region AcP2 in the X direction is smaller than the width of the p-type semiconductor region RPW, and the active region AcP2 is sandwiched on its both sides by the element isolating film 2 arranged over the n-type semiconductor region RNW (see FIG. 6). When seen in a plan view, the width of the active region AcN2 in the X direction is smaller than the width of the p-type semiconductor region RPW, and the active region AcN2 is sandwiched on its both sides by the element isolating film 2 arranged over the p-type semiconductor region RPW (see FIG. 6).

As shown in FIG. 5, the gate electrodes (gate wiring) G (G1 to G4) having a predetermined width extend in the X direction so as to cross the four active regions (AcN1, AcP1, AcP2, and AcN2) in the X direction. Each gate electrode G is formed of, for example, a polysilicon layer.

Specifically, a common gate electrode G1 is arranged so as to cross the active regions AcP1 and AcN1. In this manner, the load transistor Lo1 and the driver transistor Dr1 are arranged over the active region AcP1 and the active region AcN1, respectively, and their gate electrodes (G) are connected thereto. The common gate electrode G1 extends to a location over the active region AcP2, and is connected to the drain region of the load transistor Lo2.

Over the active region AcN1, a gate electrode G2 is arranged in parallel with the common gate electrode G1. In this manner, the access transistor Acc1 is arranged over the active region AcN1, and the drain region of the driver transistor Dr1 and one of the source/drain regions of the access transistor Acc1 are connected to each other (to be a common part). The gate electrode G2 extends from the active region AcN1 to a location over the element isolating region STI, and is connected to the word line WL extending in the X direction.

A common gate electrode G3 is arranged so as to cross over the active regions AcP2 and AcN2. In this manner, the load transistor Lo2 and the driver transistor Dr2 are arranged over the active region AcP2 and the active region AcN2, respectively, and their gate electrodes (G) are connected thereto. The common gate electrode G3 extends to a location over the active region AcP1, and is connected to the drain region of the load transistor Lo1.

Over the active region AcN2, a gate electrode G4 is arranged in parallel with the common gate electrode G3. In this manner, the access transistor Acc2 is arranged over the active region AcN2, and the drain region of the driver transistor Dr2 and one of the source/drain regions of the access transistor Acc2 are connected thereto (to be a common part). The gate electrode G4 extends from the active region AcN2 to a location over the element isolating region STI, and is connected to the word line WL extending in the X direction.

Each two of the above-described four gate electrodes G1 to G4 are arranged on the same line (linearly). Specifically, the common gate electrode G1 crossing over the active regions AcP1 and AcN1 and the gate electrode G4 over the active region AcN2 are arranged on the same line extending in the X direction. The common gate electrode G3 crossing over the active regions AcP2 and AcN2 and the gate electrode G2 over the active region AcN1 are arranged on the same line extending in the X direction. Each of the four gate electrodes G1 to G4 is rectangular and extends with an equal width in the X direction. The four gate electrodes G1 to G4 also have the same width as each other in the Y direction. Therefore, six transistors Lo1, Dr1, Acc1, Lo2, Dr2, and Acc2 making up the memory cell MC are equal to each other in a channel length (that is, corresponding to the width in the Y direction of the gate electrode G in its part crossing the active region).

The drain regions of the transistors (Lo1 and Dr1) are electrically connected to each other to be the storage node VL of the left inverter of FIG. 1. Also, the drain regions of the transistors (Lo2 and Dr2) are electrically connected to each other to form the storage node VR of the right inverter of FIG. 1. The source regions of the transistors (Lo1 and Lo2) are electrically connected to the source potential Vdd, and power is supplied to the source potential Vdd through a wiring extending in the Y direction. The source regions of the driver transistors (Dr1 and Dr2) are connected to the ground potential VSS, and power is supplied to the ground potential VSS through a wiring extending in the Y direction. The other of the source/drain region each of the access transistors (Acc1 and Acc2) is electrically connected to each of the bit lines (BLT and BLB) extending the Y direction.

The p-type or n-type semiconductor regions (DNW1, LPW, LNW, DPW, RNW, RPW, and DNW2) are electrically connected to well feeder lines (DVN1, LVP, LVN, DVP, RVN, RVP, and DVN2) extending in the Y direction in the feeding area PF, respectively. The well feeder lines (DVN1, LVP, LVN, DVP, RVN, RVP, and DVN2) are arranged over the region where the memory cell MC is formed, so as to extend in the Y direction.

[Configuration of Memory Cell Array]

Figure 7:
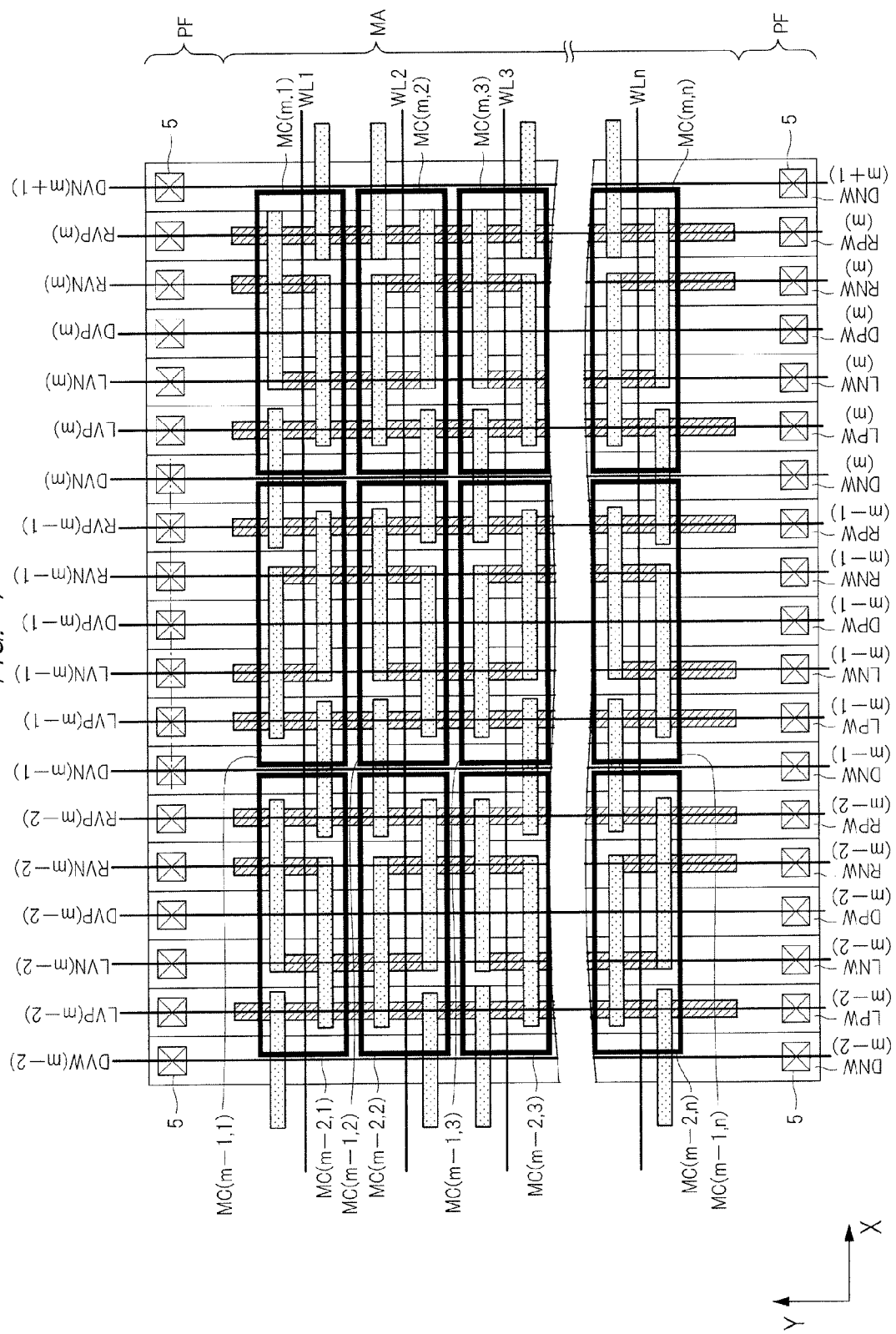
FIG. 7 is a plan view of a principle part showing a memory array of the SRAM and a feeding area according to the present embodiment.
Figure 8:
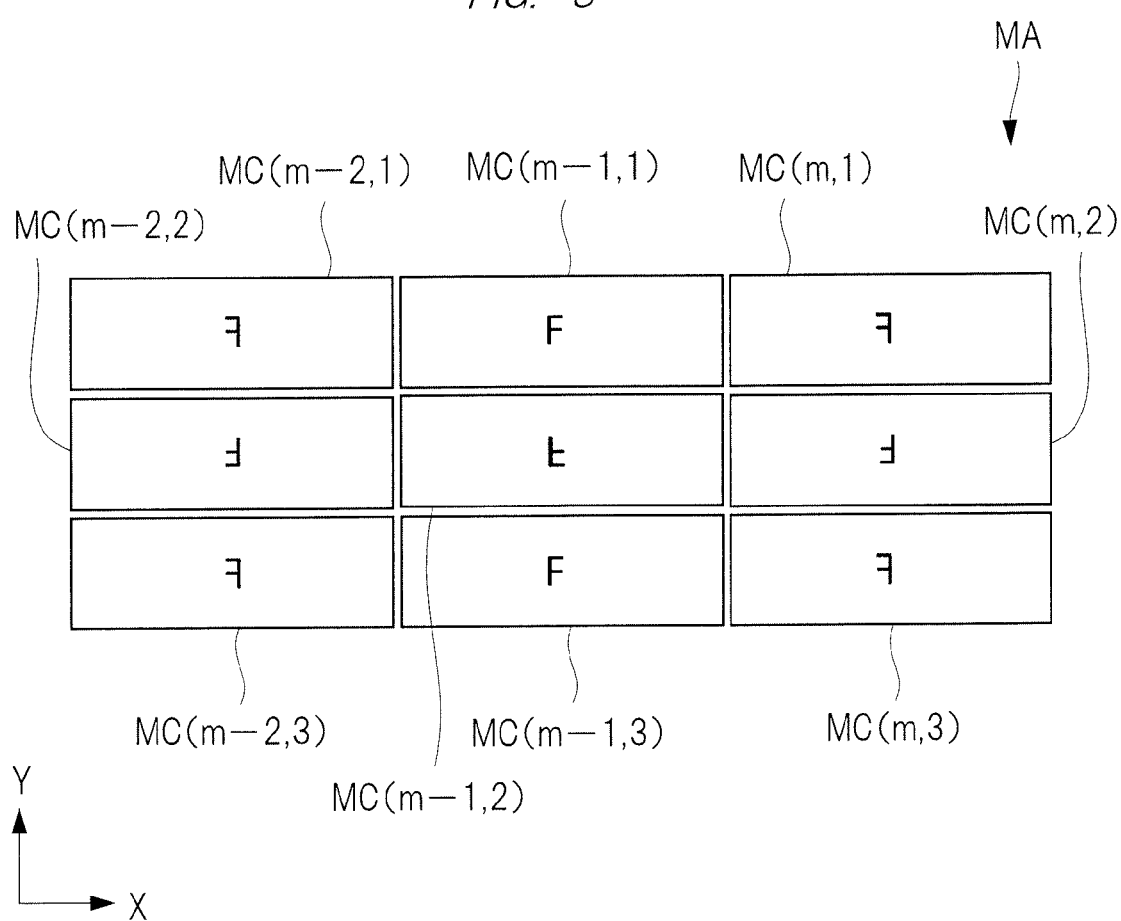
FIG. 8 is a plan view showing a concept of the memory array of the SRAM according to the present embodiment.

FIG. 7 is a plan view of the SRAM memory array and the feeding region according to the present embodiment. FIG. 8 is a plan view showing a concept of the SRAM memory array according to the present embodiment.

FIG. 7 schematically shows the memory cell. Although the word line extending in the X direction is shown, the bit line extending in the Y direction is not shown.

The memory array MA is configured of a plurality of memory cells arranged in a row and a column. The memory array MA of the present embodiment is configured of memory cells arranged in "m" columns in the X direction and in "n" rows in the Y direction. FIG. 7 shows the memory cells arranged from the (m−2)-th column to the m-th column, and arranged in the first row to the third row and the n-th row. A memory cell arranged at the m-th column and n-th row is denoted by a mark "MC (m, n)".

A memory cell MC (m−1, n) is formed by using seven semiconductor regions (DNW(m−1), LPW(m−1), LNW(m−1), DPW(m−1), RNW(m−1), RPW(m−1), and DNW(m)). In the X direction, a memory cell MC (m, n) adjacent to the memory cell MC (m−1, n) is formed by using seven semiconductor regions (DNW(m), LPW(m), LNW(m), DPW(m), RNW(m), RPW(m), and DNW(m+1)). That is, in the X direction, the semiconductor region (DNW (m)) is shared between the memory cell MC (m−1, n) and memory cell MC(m, n) adjacent to each other.

Similarly, in the X direction, the semiconductor region (DNW (m−1)) is shared between a memory cell MC (m−2, n) and the memory cell MC(m−1, n) adjacent to each other.

For example, the seven semiconductor regions to be the back gates (DNW(m), LPW(m), LNW(m), DPW(m), RNW(m), RPW(m), and DNW(m+1)) of the memory cell MC(m, n) are electrically connected to well feeder lines (DVN(m), LVP(m), LVN(m), DVP(m), RVN(m), RVP(m), and DVN(m+1)), respectively. These well feeder lines (DVN(m), LVP(m), LVN(m), DVP(m), RVN(m), RVP(m), and DVN(m+1)) extend over the memory array MA in the Y direction and are electrically connected to the seven semiconductor regions (DNW(m), LPW(m), LNW(m), DPW(m), RNW(m), RPW(m), and DNW(m+1)) at contacts 5 of the feeding region (feeder portion) PF arranged on both sides of the memory array MA in the Y direction. The memory array MA does not have the contacts 5 for connecting the well feeder lines (DVN(m), LVP(m), LVN(m), DVP(m), RVN(m), RVP(m), and DVN (m+1)) to the semiconductor regions (DNW(m), LPW(m), LNW(m), DPW(m), RNW(m), RPW(m), and DNW(m+1)). While the feeding region PF is arranged on both sides of the memory array MA, it may be arranged on only one side of the memory array MA.

Next, with reference to FIG. 8, a concept of (method of arranging) the memory cells in the memory array MA will be described. FIG. 8 shows the memory cells arranged in "3 columns×3 rows" shown in FIG. 7.

The arrangement of the gate electrodes (G1 to G4) and the active regions (AcN1, AcP1, AcP2, and AcN2) in the memory cell which has been described with reference to FIG. 5 is denoted as "F", and FIG. 8 shows a case that the memory cell ((m−1), 1)) has "F" arrangement. The memory cells adjacent to each other in the X and Y directions have a line-symmetrical arrangement relation. For example, a memory cell ((m), 1)) and a memory cell ((m−1), 1)) have line symmetry across a virtual line which extends in the Y direction along the boundary between both of the memory cells. Also, a memory cell ((m−1), 2)) and the memory cell ((m−1), 1)) have line symmetry across a virtual line which extends in the X direction along the boundary between both of the memory cells.

In this manner, by arranging the adjacent memory cells so as to have line symmetry, the gate electrodes or active regions of the adjacent memory cells can be continuously formed, and therefore, an area of the memory array can be reduced.

[Memory Operation]

Next, with reference to FIGS. 1 to 6 and 9 to 11, a write operation of the SRAM memory cell will be described.

Figure 10:
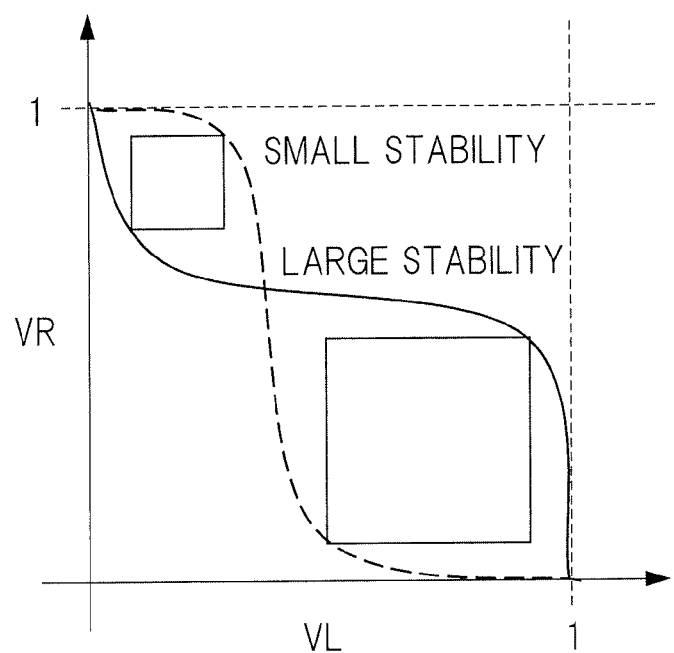
FIG. 10 is a diagram showing a butterfly curve caused at the time of the write operation of the memory cell of the SRAM according to the present embodiment.
Figure 11:
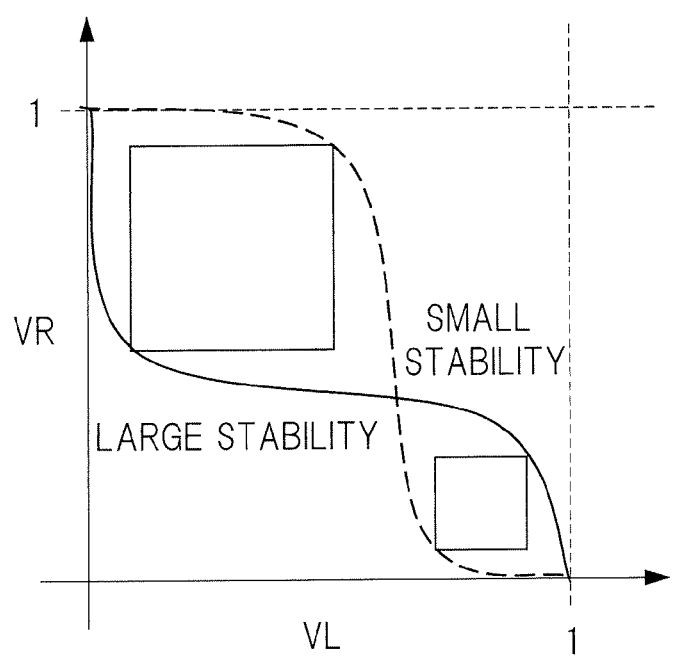
FIG. 11 is a diagram showing a butterfly curve caused at the time of the write operation of the memory cell of the SRAM according to the present embodiment.

FIG. 9 is a table showing the potentials of well feeder lines caused in the write operation of the SRAM memory cell of the present embodiment. FIGS. 10 and 11 are diagrams showing butterfly curves caused in the write operation of the SRAM memory cell of the present embodiment. In FIG. 9, the writing "1" means an operation of writing a "High" level to the storage node VL of the left inverter of the memory cell of FIG. 1, and the writing "0" means an operation of writing a "Low" level to the storage node VL thereof. The "High" level and the "Low" level will be referred to as an "H" level and an "L" level.

First, the writing "1" will be described. That is, this is cases that the voltage level of the storage node VL of FIG. 1 is shifted from the "L" level to the "H" level and that the voltage level of the storage node VR is shifted from the "H" level to the "L" level. In these cases, the semiconductor regions (LNW, LPW, RNW, and RPW) which are the back gates of the transistors (Lo1, Dr1, Lo2, and Dr2) of the memory cell MC are fixed at potentials shown in FIG. 9 through the well feeder lines (LVN, LVP, RVN, and RVP). Also, the semiconductor regions (DPW, DNW1, and DNW2) are also fixed at potentials shown in FIG. 9 through the well feeder lines (DVP, DVN1, and DVN2). For example, the potentials are as "Va=-2 [V]", "Vb=0.2 [V]", and "Vc=2 [V]".

In the writing "1" operation, the bit line BLT and bit line BLB of FIG. 1 are set to the "H" level and the "L" level, respectively, and besides, the word line WL is set to the "H" level, so that the access transistors Acc1 and Acc2 are switched on. The storage node VL is charged through the bit line BLT and the transistor Lo1, so that the storage node VL is shifted from the "L" level to the "H" level. Meanwhile, the storage node VR is discharged through the bit line BLB and the driver transistor Dr2, so that the storage node VR is shifted from the "H" level to the "L" level. At this time, the semiconductor regions (LNW and LPW) which are the back gates of the transistors (Lo1 and Dr1) are fixed to "-Vb", and therefore, a threshold voltage for the load transistor Lo1 can be decreased while a threshold voltage for the driver transistor Dr1 can be increased, so that the storage node VL can be rapidly shifted from the "L" level to the "H" level. Also, the potential of the semiconductor regions (RNW and RPW) which are the back gates of the transistors (Lo2 and Dr2) are fixed to "Vb", and therefore, a threshold voltage for the load transistor Lo2 can be increased while a threshold voltage for the driver transistor Dr2 can be decreased, so that the storage node VR can be rapidly shifted from the "H" level to the "L" level.

FIG. 10 shows the butterfly curves caused in the writing "1" operation. A solid line represents characteristics of an output (VL) with respect to an input (VR) in the left inverter, and a broken line represents characteristics of an input (VR) with respect to an output (VL) in the right inverter. A stability is larger as an area of a square surrounded with the solid line and the broken line is larger. That is, the stability is obtained on the "H"-level side of the storage node VL, so that the characteristics of the large stability is obtained in the writing "1" operation.

Next, the writing "0" will be described. That is, this is cases that the storage node VL of FIG. 1 is shifted from the "H" level to the "L" level, and that the storage node VR is shifted from the "L" level to the "H" level. The potentials of the semiconductor regions DNW1, LPW, LNW, DPW, RNW, RPW, and DNW2 caused at this time are as shown in FIG. 9.

In the writing "0" operation, the bit line BLT and bit line BLB of FIG. 1 are set to the "L" level and the "H" level, respectively, and besides, the word line WL is set to the "H" level, so that the access transistors Acc1 and Acc1 are switched on. And, the storage node VL is discharged through the bit line BLT and the driver transistor Dr1, so that the storage node VL is shifted from the "H" level to the "L" level. Also, the storage node VR is charged through the bit line BLB and the load transistor Lo2, so that the storage node VR is shifted from the "L" level to the "H" level. At this time, the semiconductor regions (LNW and LPW) which are the back gates of the transistors (Lo1 and Dr1) are fixed to "Vb", and therefore, the threshold voltage for the load transistor Lo1 can be increased while the threshold voltage for the driver transistor Dr1 can be decreased, so that the storage node VL can be rapidly shifted from the "H" level to the "L" level. Also, the semiconductor regions (RNW and RPW) which are the back gates of the transistors (Lo2 and Dr2) are fixed to "-Vb", and therefore, the threshold voltage for the load transistor Lo2 can be decreased while the threshold voltage for the driver transistor Dr2 can be increased, so that the storage node VR can be rapidly shifted from the "L" level to the "H" level.

FIG. 11 shows the butterfly curves caused in the writing "0" operation. A solid line represents characteristics of the output (VL) with respect to the input (VR) in the left inverter, and a broken line represents characteristics of the output (VL) with respect to the input (VR) in the right inverter. A stability is larger as an area of a square surrounded with the solid line and the broken line is larger. That is, the stability is obtained on the "L"-level side of the storage node VL, so that the characteristics of the large stability is obtained in the writing "0" operation.

Main Feature and Effect of the Present Embodiment

The four semiconductor regions (well regions) which are electrically independent and function as the back gates are provided below the two load transistors (Lo1 and Lo2) and two driver transistors (Dr1 and Dr2) included in the SRAM memory cell, respectively, and the threshold voltages for the load transistors (Lo1 and Lo2) and the driver transistors (Dr1 and Dr2) are controlled, so that the writing stability of the SRAM memory cell can be improved. Besides, the writing speed can be improved. Also, by dividing the two n-type semiconductor regions (well regions, n-well regions) (LNW and RNW) provided below the two load transistors (Lo1 and Lo2) by the p-type semiconductor region (well region, dummy well region, dummy p-well region) DPW, a semiconductor device with high reliability or high manufacturing yield can be provided. If the two n-type semiconductor regions (well regions, n-well regions) are divided by a deep trench in which an insulating film is embedded, there are concerns about the decrease in the reliability and the decrease in the manufacturing yield.

Regarding the two load transistors (Lo1 and Lo2) and two driver transistors (Dr1 and Dr2) included in the SRAM memory cell, when seen in a plan view, the driver transistor Dr1, the load transistor Lo1, the load transistor Lo2, and the driver transistor Dr2 are arranged sequentially in the direction of extension of the word line WL. Below these four transistors, the p-type semiconductor region (p-well region)

LPW, the n-type semiconductor region (n-well region) LNW, the n-type semiconductor region (n-well region) RNW, and the p-type semiconductor region (p-well region) RPW, which are the back gates, are arranged in this order. Further, the p-type semiconductor region (dummy p-well region) DPW is arranged between the n-type semiconductor region (n-well region) LNW and the n-type semiconductor region (n-well region) RNW, and the p-type semiconductor region (dummy p-well region) DPW is supplied with a voltage Va (<-Vb) lower than a potential (Vb or -Vb) applied to the n-type semiconductor region (n-well region) LNW or n-type semiconductor region (n-well region) RNW adjacent to the p-type semiconductor region DPW so that a pn junction formed with the adjacent n-type semiconductor region (n-well region) LNW or n-type semiconductor region (n-well region) RNW does not become forward bias state, and therefore, generation of leakage current caused by a parasitic bipolar operation can be prevented.

This point will be described in detail with reference to FIGS. 12 and 13.

Figure 12:
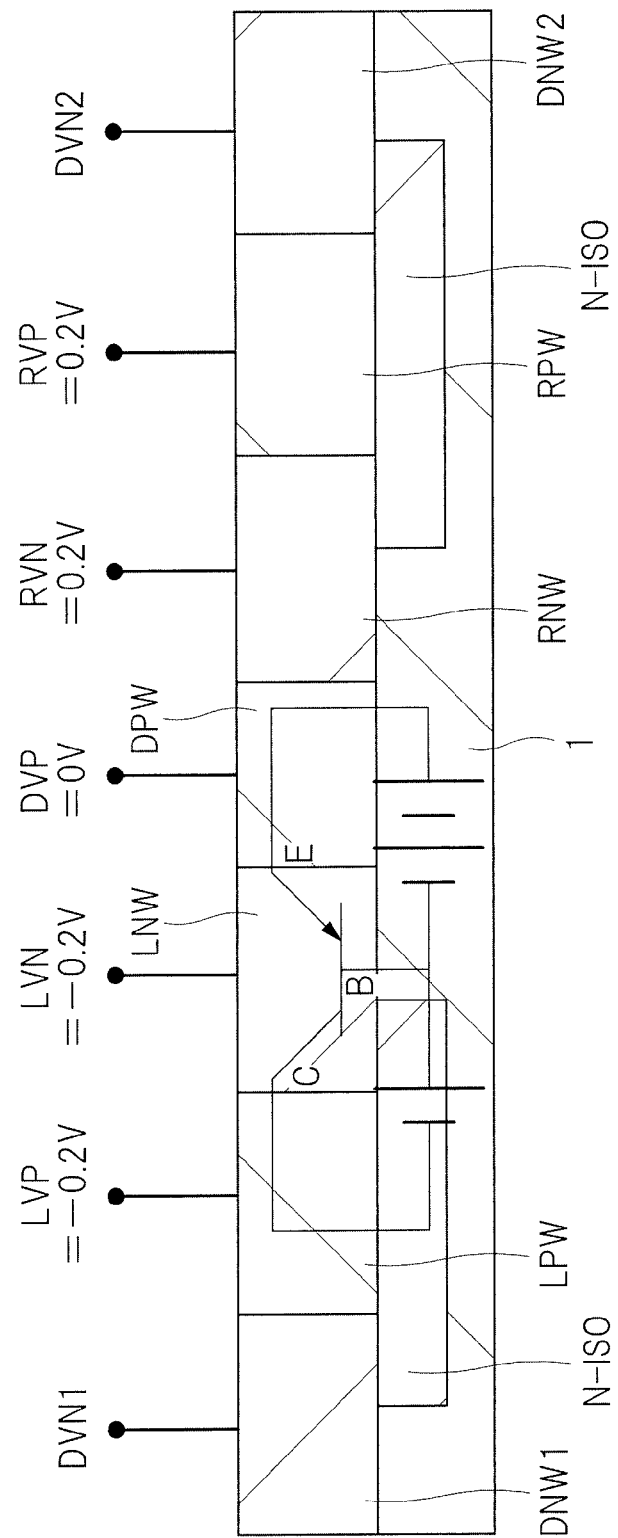
FIG. 12 is a diagram for explaining an effect of the memory cell of the SRAM according to the present embodiment.
Figure 13:
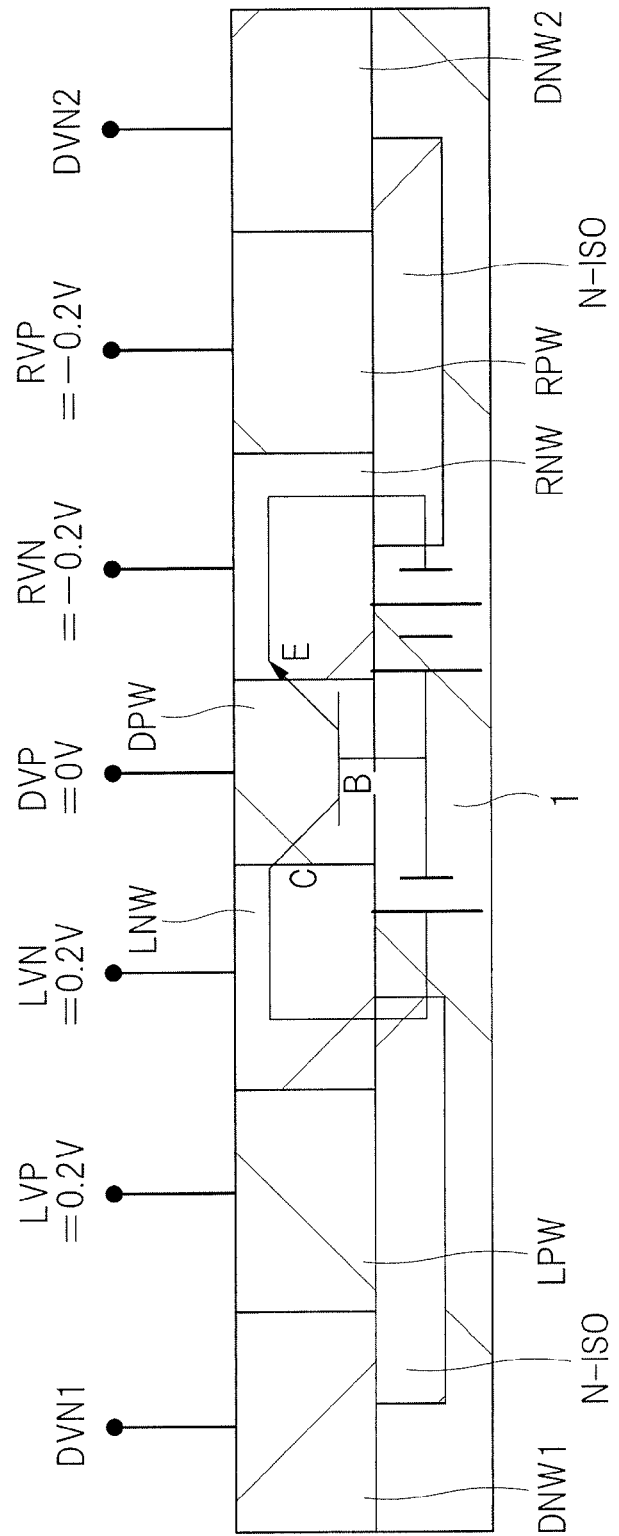
FIG. 13 is a diagram for explaining an effect of the memory cell of the SRAM according to the present embodiment.

FIGS. 12 and 13 are diagrams for explaining an effect of the SRAM memory cell according to the present embodiment. FIGS. 12 and 13 are diagrams showing the semiconductor regions (well regions) functioning as the back gates, which are diagrams obtained by omitting the transistors (DR1, Lo1, Lo2, and Dr2), the buried insulating film BOX, and the element isolating film 2 from the cross-sectional view of FIG. 6. For easily understanding, the semiconductor regions (LPW, LNW, DPW, RNW, and RPW) are fixed to a specific value potential (Vb=0.2 [V]).

FIG. 12 is a diagram for explaining a problem that arises in the writing "1" operation, and the semiconductor regions (LPW, LNW, DPW, RNW, and RPW) are fixed to potentials shown in FIG. 12. As different from the potential relation of FIG. 9, the potential of the semiconductor region DPW is set to 0 [V]. In the potential relation of FIG. 12, there are concerns that the pn junction between the p-type semiconductor region DPW and the n-type semiconductor region LNW is in the forward bias state, and a pnp parasitic bipolar made up of the p-type semiconductor region DPW, the n-type semiconductor region LNW, and the p-type semiconductor region LPW is switched on, which results in increase in the leakage current. In the SRAM of the present embodiment, in the writing "1" operation, the p-type semiconductor region DPW is fixed to, for example, "Va=-2" [V]. Therefore, the pn junction between the p-type semiconductor region DPW and the n-type semiconductor region RNW is in reverse bias state, and the above-described parasitic bipolar is not switched on, so that the increase in the leakage current can be prevented.

FIG. 13 is a diagram for explaining a problem that arises in the writing "0" operation, and the potentials of the semiconductor regions (LPW, LNW, DPW, RNW, and RPW) are as shown in the drawing. In this case, there are concerns that the pn junction between the p-type semiconductor region DPW and the n-type semiconductor region LNW is in the forward bias state, and an npn parasitic bipolar made up of the n-type semiconductor region LNW, the p-type semiconductor region DPW, and the n-type semiconductor region RNW is switched on, which results in increase in the leakage current. However, in the SRAM of the present embodiment, in the writing "0" operation, the semiconductor region DPW is fixed to, for example, "Va=-2" [V]. Therefore, the pn junction between the p-type semiconductor region DPW and the n-type semiconductor region RNW is in reverse bias state, and the above-described parasitic bipolar is not switched on, so that the increase in the leakage current can be prevented.

That is, in the writing "0" operation, the p-type semiconductor region DPW sandwiched between the n-type semiconductor regions (LNW and RNW) is fixed to Va (<-Vb) which is a potential lower than both potentials of the n-type semiconductor regions (LNW and RNW), so that the leakage current caused by the above-described parasitic bipolar can be prevented.

Also, as shown in FIG. 7, an n-type semiconductor region (n-well region, dummy n-well region) DNW(m-1) is arranged on the boundary between the memory cell MC(m-1, 1) and the memory cell MC(m-2, 1), and an n-type semiconductor region (n-well region, dummy n well region) DNW(m) is arranged on the boundary between the memory cell MC (m-1, 1) and the memory cell MC (m, 1). Therefore, independent potentials from each other can be supplied to the p-type semiconductor region (p-well region) RPW (m-2) of the memory cell MC(m-2, 1) and to the p-type semiconductor region (p-well region) LPW(m-1) of the memory cell MC(m-1, 1). Similarly, independent potentials from each other can be supplied to the p-type semiconductor region (p-well region) RPW(m-1) of the memory cell MC(m-1, 1) and to the p-type semiconductor region (p-well region) LPW(m) of the memory cell MC(m, 1).

Also, the two active regions where the two load transistors (Lo1 and Lo2) included in the SRAM memory cell are formed are electrically isolated from each other by the element isolating film 2, while the two n-type semiconductor regions (well regions, n-well regions) (LNW and RNW) which are the back gates of the two load transistors (Lo1 and Lo2) are electrically isolated from each other by the p-type semiconductor region (well region, dummy p-well regions) DPW. Therefore, the element isolating film 2 can be thinned, and isolation (insulation) reliability can be improved even in the narrow element isolating film 2 when seen in a plan view.

The p-type or n-type semiconductor regions (DNW1, LPW, LNW, DPW, RNW, RPW, and DNW2) are electrically connected to the well feeder lines (DVN1, LVP, LVN, DNP, RVN, RVP, and DVN2) extending in the Y direction, respectively, in the feeding region PF positioned outside the memory array MA. Therefore, it is not required to provide the feeding region PF in the memory array MA or memory cell MC, so that the memory array MA or memory cell MC can be downsized.

Also, in the direction of extension of the word lines WL, a width of the n-type semiconductor region (well region, n-well region) LNW which is the back gate of the load transistor Lo1 can be larger i than a width of the active region where the load transistor Lo1 is formed, so that the resistance of the n-type semiconductor region (well region, n-well region) LNW can be reduced. Therefore, in the feeding region PF positioned outside the memory array MA, the n-type semiconductor region (well region, n-well region) LNW and the well feeder line LVN can be configured so as to be electrically connected to each other.

In the foregoing, the invention made by the present inventor has been concretely described based on the embodiments. However, it is needless to say that the present invention is not limited to the foregoing embodiments and various modifications and alterations can be made within the scope of the present invention.

What is claimed is:

1. A semiconductor device comprising:
a semiconductor substrate having a main surface;

a semiconductor layer which is formed over the main surface of the semiconductor substrate through a buried insulating film;

a first n-well region and a second n-well region which are formed in the main surface of the semiconductor substrate and which extend in a first direction of the main surface;

a dummy p-well region which is provided between the first n-well region and the second n-well region and which extends in the first direction;

a first p-well region which is adjacent to the first n-well region on an opposite side of the dummy p-well region and which extends in the first direction;

a second p-well region which is adjacent to the second n-well region on an opposite side of the dummy p-well region and which extends in the first direction;

a first bit line and a second bit line each of which extends in the first direction;

a plurality of memory cells each of which is connected to the first bit line and the second bit line; and a plurality of word lines which are connected to the plurality of memory cells, respectively, and each of which extends along a second direction crossing the first direction, wherein each of the plurality of memory cells includes:

a first p-channel transistor which is provided in the semiconductor layer over the first n-well region, whose drain is connected to a first storage node, and whose gate is connected to a second storage node;

a first n-channel transistor which is provided in the semiconductor layer over the first p-well region, whose drain is connected to the first storage node, and whose gate is connected to the second storage node;

a second p-channel transistor which is provided in the semiconductor layer over the second n-well region, whose drain is connected to the second storage node, and whose gate is connected to the first storage node;

a second n-channel transistor which is provided in the semiconductor layer over the second p-well region, whose drain is connected to the second storage node, and whose gate is connected to the first storage node;

a third n-channel transistor which is provided in the semiconductor layer, and which electrically connects the first bit line to the first storage node; and a fourth n-channel transistor which is provided in the semiconductor layer, and which electrically connects the second bit line to the second storage node.

2. The semiconductor device according to claim 1,
wherein a surface of the semiconductor layer has an element isolating region and a plurality of active regions defined by the element isolating region when seen in a plan view, and, in the element isolating region, an element isolating film having a thickness larger than a total thickness of the buried insulating film and the semiconductor layer is formed.

3. The semiconductor device according to claim 2,
wherein a boundary between the first n-well region and the first p-well region is positioned in the element isolating region when seen in a plan view.

4. The semiconductor device according to claim 2,
wherein the plurality of active regions include: a first active region where the first p-channel transistor is formed; a second active region where the first n-channel transistor is formed; a third active region where the second p-channel transistor is formed; and a fourth active region where the second n-channel transistor is formed.

5. The semiconductor device according to claim 4,
wherein, when seen in a plan view, the first active region is positioned over the first n-well region, the second active region is positioned over the first p-well region, the third active region is positioned over the second n-well region, and the fourth active region is positioned over the second p-well region.

6. The semiconductor device according to claim 5,
wherein the third n-channel transistor is formed in the second active region, and the fourth n-channel transistor is formed in the fourth active region.

7. The semiconductor device according to claim 4,
wherein, in the second direction when seen in a plan view, the element isolating region is formed between the first active region and the third active region, and the dummy p-well region is arranged below the element isolating film in the element isolating region.

8. The semiconductor device according to claim 1,
wherein, when "0" information is written in the first storage node, a desired positive voltage "Vb" is applied to the first n-well region and to the first p-well region while a desired negative voltage "−Vb" is applied to the second n-well region and to the second p-well region.

9. The semiconductor device according to claim 8,
wherein a voltage lower than the desired negative voltage "−Vb" is applied to the dummy p-well region.

10. The semiconductor device according to claim 9, comprising
a dummy n-well region which is adjacent to the first p-well region and which extends in the first direction on an opposite side of the first n-well region,
wherein a voltage higher than the desired positive voltage "Vb" is applied to the dummy n-well region.

11. The semiconductor device according to claim 1, further comprising:
a first feeder portion and a second feeder portion which are arranged on both sides of the plurality of memory cells connected to the first bit line and the second bit line in the first direction;
a first n-well feeder line which extends along the first direction and which is electrically connected to the first n-well region in the first feeder portion and the second feeder portion;
a first p-well feeder line which extends along the first direction and which is electrically connected to the first p-well region in the first feeder portion and the second feeder portion;
a second n-well feeder line which extends along the first direction and which is electrically connected to the second n-well region in the first feeder portion and the second feeder portion; and
a second p-well feeder line which extends along the first direction and which is electrically connected to the second p-well region the first feeder portion and the second feeder portion.

12. The semiconductor device according to claim 11, further comprising
a dummy p-well feeder line which extends along the first direction and which is electrically connected to the dummy p-well region in the first feeder portion and the second feeder portion.

13. A semiconductor device comprising:
a semiconductor substrate having a main surface;

a semiconductor layer which is formed over the main surface of the semiconductor substrate through a buried insulating film;
a first active region, a second active region, a third active region, and a fourth active region which are formed in a surface of the semiconductor layer;
an element isolating region which is formed in the surface of the semiconductor layer and which surrounds the first active region, the second active region, the third active region, and the fourth active region when seen in a plan view;
a first n-well region which overlaps the first active region when seen in a plan view and which is formed in the main surface of the semiconductor substrate so as to extend in a first direction of the main surface;
a first p-well region which overlaps the second active region when seen in a plan view, which is adjacent to the first n-well region, and which extends in the first direction;
a second n-well region which overlaps the third active region when seen in a plan view and which is formed on the main surface of the semiconductor substrate so as to extend in the first direction of the main surface;
a second p-well region which overlaps the fourth active region when seen in a plan view, which is adjacent to the second n-well region, and which extends in the first direction;
a first bit line and a second bit line each of which extends in the first direction;
a plurality of memory cells each of which is connected to the first bit line and the second bit line; and
a plurality of word lines which are connected to the plurality of memory cells, respectively, and each of which extends along a second direction crossing the first direction,
wherein each of the plurality of memory cells includes:
a first p-channel transistor which is provided in the first active region, whose drain is connected to a first storage node, and whose gate is connected to a second storage node;
a first n-channel transistor which is provided in the second active region, whose drain is connected to the first storage node, and whose gate is connected to the second storage node;
a second p-channel transistor which is provided in the third active region, whose drain is connected to the second storage node, and whose gate is connected to the first storage node;
a second n-channel transistor which is provided in the fourth active region, whose drain is connected to the second storage node, and whose gate is connected to the first storage node;
a third n-channel transistor which is provided in the second active region, and which electrically connects the first bit line to the first storage node; and
a fourth n-channel transistor which is provided in the fourth active region, and which electrically connects the second bit line to the second storage node,
in the second direction, a width of the first active region is smaller than a width of the first n-well region,
in the second direction, a width of the second active region is smaller than a width of the first p-well region,
in the second direction, a width of the third active region is smaller than a width of the second n-well region, and,
in the second direction, a width of the fourth active region is smaller than a width of the second p-well region.

14. The semiconductor device according to claim 13, further comprising
a dummy p-well region which is arranged between the first n-well region and the second n-well region and which extends in the first direction when seen in a plan view.

15. The semiconductor device according to claim 14, wherein, in the element isolating region, an element isolating film having a thickness larger than a total thickness of the buried insulating film and the semiconductor layer is formed.

16. The semiconductor device according to claim 14, wherein, when "0" information is written in the first storage node, a desired positive voltage "Vb" is applied to the first n-well region and to the first p-well region while a desired negative voltage "−Vb" is applied to the second n-well region and to the second p-well region.

17. The semiconductor device according to claim 16, wherein a voltage lower than the desired negative voltage "−Vb" is applied to the dummy p-well region.

18. The semiconductor device according to claim 17, comprising
a dummy n-well region which is adjacent to the first p-well region and which extends in the first direction on an opposite side of the first n-well region,
wherein a voltage higher than the desired positive voltage "Vb" is applied to the dummy n-well region.

19. The semiconductor device according to claim 14, further comprising:
a first feeder portion and a second feeder portion which are arranged on both sides of the plurality of memory cells connected to the first bit line and the second bit line in the first direction;
a first n-well feeder line which extends along the first direction and which is electrically connected to the first n-well region in the first feeder portion and the second feeder portion;
a first p-well feeder line which extends along the first direction and which is electrically connected to the first p-well region in the first feeder portion and the second feeder portion;
a second n-well feeder line which extends along the first direction and which is electrically connected to the second n-well region in the first feeder portion and the second feeder portion; and
a second p-well feeder line which extends along the first direction and which is electrically connected to the second p-well region in the first feeder portion and the second feeder portion.

20. The semiconductor device according to claim 19, further comprising
a dummy p-well feeder line which extends along the first direction and which is electrically connected to the dummy p-well region in the first feeder portion and the second feeder portion.

* * * * *